(12) United States Patent
Lim

(10) Patent No.: US 7,704,845 B2
(45) Date of Patent: Apr. 27, 2010

(54) VARACTOR AND METHOD FOR MANUFACTURING THE SAME

(75) Inventor: Su Lim, Bucheon-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 126 days.

(21) Appl. No.: 12/002,237

(22) Filed: Dec. 13, 2007

(65) Prior Publication Data

US 2008/0237676 A1 Oct. 2, 2008

(30) Foreign Application Priority Data

Dec. 27, 2006 (KR) ................... 10-2006-0135756

(51) Int. Cl.
*H01L 21/20* (2006.01)
(52) U.S. Cl. .................. 438/379; 257/E27.049; 257/E29.344; 257/E21.364
(58) Field of Classification Search ........... 257/312, 257/E27.049, E29.344, E21.364, 595–601; 438/379
See application file for complete search history.

(56) References Cited

U.S. PATENT DOCUMENTS

| 6,521,939 B1 * | 2/2003 | Yeo et al. ................ 257/312 |
| 2003/0052388 A1 * | 3/2003 | Mheen et al. ............ 257/595 |
| 2008/0149983 A1 * | 6/2008 | Rassel et al. ........... 257/312 |

* cited by examiner

*Primary Examiner*—Davienne Monbleau
*Assistant Examiner*—Shweta Mulcare
(74) *Attorney, Agent, or Firm*—The Law Offices of Andrew D. Fortney; Andrew D. Fortney; Duangkamol Kay Strohl

(57) ABSTRACT

Disclosed is a varactor and/or variable capacitor. The varactor/variable capacitor includes a plurality of first conductive-type wells vertically formed on a substrate, a plurality of second conductive-type ion implantation areas formed in the first conductive-type wells, at least one second conductive-type plug electrically connected to the second conductive-type ion implantation areas, an isolation layer formed at sides of an uppermost second conductive-type ion implantation area, and a first conductive-type ion implantation area in an uppermost first conductive-type well electrically disconnected from the uppermost second conductive-type ion implantation area by the isolation area.

20 Claims, 5 Drawing Sheets

VARACTOR AND METHOD FOR MANUFACTURING THE SAME

The present application claims the benefit under 35 U.S.C. §119 of Korean Patent Application No. 10-2006-0135756, filed Dec. 27, 2006, which is hereby incorporated by reference in its entirety.

BACKGROUND

Diodes include vacuum tube diodes and semiconductor diodes. The semiconductor diodes include a point-contact diode, a junction diode, a tunnel diode, a photo-diode, and a varactor diode.

A varactor diode is a variable reactor diode, and the capacitance thereof changes according to the applied voltage. (Hereinafter, the term "varactor" will be used to refer to a varactor diode or a variable capacitor.)

According to a related technology, an N+/P well junction varactor has been manufactured using a CMOS process. However, if a large capacitance (Cjo) is required in the related N+/P well varactor, the size of a corresponding N+ area must be increased. Accordingly, the size of the element must be enlarged.

BRIEF SUMMARY

Embodiments of the invention provide a varactor and a method for manufacturing the same, capable of obtaining large capacitance even if the varactor has a small size.

According to the embodiment, a varactor includes a plurality of first conductive-type wells vertically formed on a substrate, a plurality of second conductive-type ion implantation areas formed in the first conductive-type wells, respectively, at least one second conductive-type plug to be electrically connected to the second conductive-type ion implantation areas, an isolation layer formed at both sides of an uppermost second conductive-type ion implantation area among the second conductive-type ion implantation areas, and a first conductive-type ion implantation area in an uppermost first conductive-type well among the first conductive-type wells electrically disconnected from the uppermost second conductive-type ion implantation area by the isolation area.

According to embodiments of the invention, a method for manufacturing a varactor includes the steps of forming a first well by implanting a first conductive-type ion onto a substrate, forming a first ion implantation area by implanting a second conductive-type ion into the first well, forming an epitaxial layer on the substrate having the first ion implantation area therein, forming an isolation area in the epitaxial layer at sides of the first ion implantation area, forming a second well by implanting the first conductive-type ions into the epitaxial layer having the isolation area therein except for a predetermined plug area, forming a first plug by implanting second conductive-type ions into the epitaxial layer corresponding to the plug area, in which the first plug is electrically connected to the first ion implantation area, forming a second ion implantation area by implanting second conductive-type ions into the second well on the first ion implantation area, such that the second ion implantation area is electrically connected to the first plug, and forming a first conductive-type ion implantation area in a portion of the second well electrically disconnected from the second ion implantation area by the isolation area.

According to other embodiments, a method for manufacturing a varactor includes the steps of forming a first well by implanting a first conductive-type ion into a substrate, forming a first ion implantation area by implanting a second conductive-type ion into the first well, forming a first epitaxial layer on the substrate having the first ion implantation area therein, forming a first plug by implanting second conductive-type ions into a portion of the first epitaxial layer, in which the first plug is electrically connected to the first ion implantation area, forming a second well through a first implantation process into the first epitaxial layer, forming a second ion implantation area by implanting second-conductive type ions into the second well on the first ion implantation area, forming a second epitaxial layer on the first epitaxial layer having the second ion implantation area therein, forming an isolation area in the second epitaxial layer at sides of the second ion implantation area, forming a third well by implanting first conductive-type ions onto the second epitaxial layer having the isolation area therein (and optionally blocking a portion of the second epitaxial area), forming a second plug by implanting second conductive-type ions into the second epitaxial area, in which the second plug is electrically connected to the second ion implantation area, forming a third ion implantation area by implanting second conductive-type ions into the third well, so that the third ion implantation area is electrically connected to the second plug, and forming a first conductive-type ion implantation area on a portion of the third well electrically disconnected from the third ion implantation area by the isolation area.

DETAILED DESCRIPTION OF THE EMBODIMENTS

Hereinafter, a varactor and a method for manufacturing the same according to embodiments of the invention will be described with respect to the accompanying drawings.

In the description of the exemplary embodiments, it will be understood that when a layer (or film) is referred to as being 'on' another layer or substrate, it can be directly on another layer or substrate, or intervening layers may also be present. Further, it will be understood that when a layer is referred to as being 'under' another layer, it can be directly under another layer, and one or more intervening layers may also be present. In addition, it will also be understood that when a layer is referred to as being 'between' two layers, it can be the only layer between the two layers, or one or more intervening layers may also be present.

Figure 1:
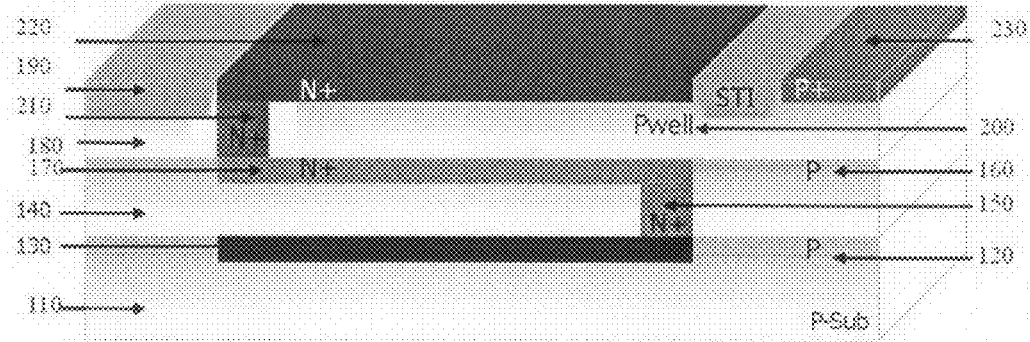
FIG. 1 is a sectional view showing a varactor according to an exemplary embodiment.

FIG. 1 is a sectional view showing a varactor according to the embodiment.

A varactor according to exemplary embodiments includes a plurality of first conductive-type wells 120, 160, and 200 vertically formed on a substrate 110, second conductive-type ion implantation areas 130, 170, and 220 formed in the first conductive-type wells 120, 160, and 200, second conductive-type plugs 150 and 210 electrically connected to the second conductive-type ion implantation areas, an isolation layer 190 formed at sides of the uppermost second conductive-type ion implantation area 220, and a first conductive-type ion implantation area 230 formed in the uppermost conductive-type well 200 and electrically disconnected from the uppermost second conductive-type ion implantation area 220 by an isolation area 190. In a further embodiment, second conductive-type ion implantation areas 130 and 170 and the first plug 150 may extend or be located under isolation area 190.

In this case, although the first conductive-type wells 120, 160, and 200 are formed by implanting P-type ions (e.g., B), and the second conductive-type ion implantation areas 130, 170, and 220 are implanted with N-type ions (e.g., P, As and/or Sb), the embodiments are not limited thereto. For example, the various wells and ion implantation areas may contain the complementary type of ion.

Further, the first conductive-type wells 120, 160, and 200 may have the same potential, the second conductive-type ion implantation areas 130, 170, and 220 may be implanted with a high concentration of N-type ions, and the ion implantation area 230 may be implanted with a high concentration P-type ions.

According to exemplary embodiments, a new N+/P well junction varactor device having a relatively large capacitance can be realized with the same size as that of the related N+/P well junction varactor.

Hereinafter, a method for manufacturing a varactor according to various embodiments will be described.

FIGS. 2 to 13 are sectional views showing an exemplary method for manufacturing a varactor.

The method for manufacturing the varactor according to embodiments of the invention can obtain high capacitance even with the same size as that of the related varactor by providing a plurality of vertical first conductive-type wells 120, 160, and 200 on the substrate 110, forming the second conductive-type ion implantation areas 130, 170, and 220 in the first conductive-type wells, and forming at least one second conductive-type plug which electrically connects adjacent second conductive-type ion implantation areas.

Although three first conductive-type wells 120, 160, and 200, three second conductive type ion implantation areas 130, 170, and 220, and two plugs 150 and 210 are provided, the embodiment is not limited thereto. In other words, the number of the first conductive-type wells may be two, three, four or more, etc. Naturally, the number of the second conductive-type ion implantation areas and the number of plugs may be changed according to the number of the first conductive-type wells (e.g., the number of second conductive-type ion implantation areas may equal the number of the first conductive-type wells, and the number of plugs may be one less than the number of the first conductive-type wells).

Meanwhile, although the first conductive-type wells 120, 160, and 200 are formed by implanting P-type ions, and the second conductive-type ion implantation areas 130, 170, and 220 are implanted with N-type ions, the embodiment is not limited thereto. For example, the complementary arrangement may be implemented (e.g., the first conductive-type wells 120, 160, and 200 may be formed by implanting N-type ions, and the second conductive-type ion implantation areas 130, 170, and 220 may be implanted with P-type ions).

In addition, the first conductive-type wells 120, 160, and 200 may have the same potential, the second conductive-type ion implantation areas 130, 170, and 220 may be implanted with a high density of N-type ions, and the ion implantation area 230 may be implanted with a high concentration of P-type ions.

Figure 2:
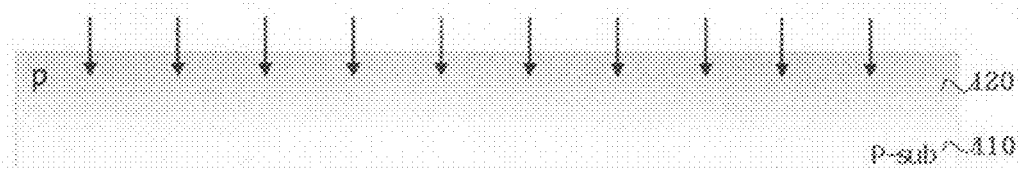
FIGS. 2 to 13 are sectional views showing a method for manufacturing a varactor according to exemplary embodiments of the invention.

As shown in FIG. 2, a first well 120 is formed by implanting first conductive-type ions into the substrate 110. The first well 120 may be formed by implanting P-type ions in a blanket (e.g., unmasked) ion implantation process.

Figure 3:
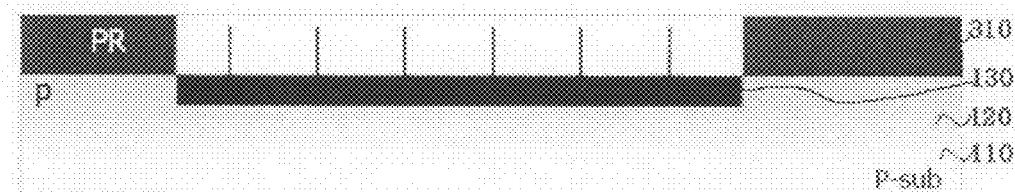

Then, as shown in FIG. 3, second conductive-type ions are implanted into the first well 120 using a first photoresist pattern 310 as a mask, thereby forming a first ion implantation area 130. The first ion implantation area 130 may be implanted with a high concentration of N-type ions. The first well 120 has a depth greater than that of the first ion implantation area 130, but the first ion implantation area 130 has a dose or concentration greater than that of the first well 120, generally by about 1 to 2 orders of magnitude.

Figure 4:
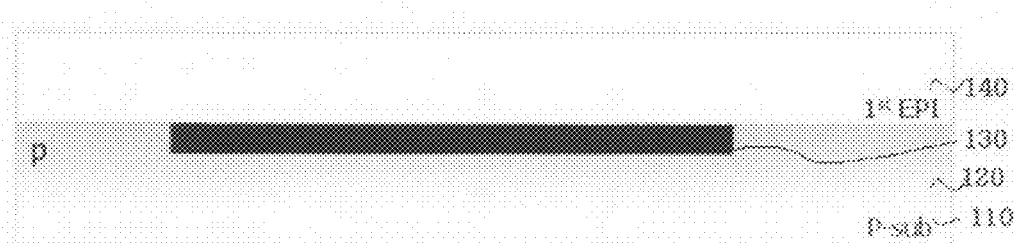

Thereafter, as shown in FIG. 4, the first photoresist pattern 310 is removed, and a first epitaxial layer 140 is formed (generally by epitaxial growth and/or deposition) on the substrate 110 having the first ion implantation area 130 therein. The first epitaxial layer 140 may comprise epitaxial silicon or silicon-germanium.

Figure 5:
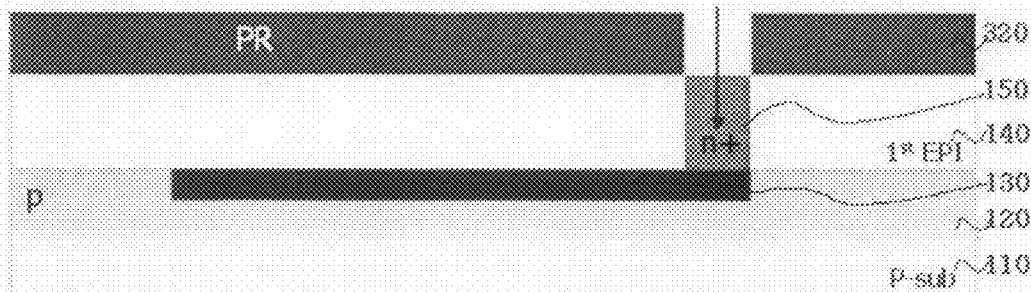

Then, as shown in FIG. 5, second conductive-type ions are implanted into a portion of the first epitaxial layer 140 using a second photoresist pattern 320 as a mask, thereby forming the first plug 150, electrically connected to the first ion implantation area 130. The first plug 150 may be implanted with a high concentration of N-type ions. The first plug 150 thus has a depth of at least the thickness of the first epitaxial layer 140, and has a dose or concentration generally about the same as or greater than that of the first ion implantation area 130.

Figure 6:
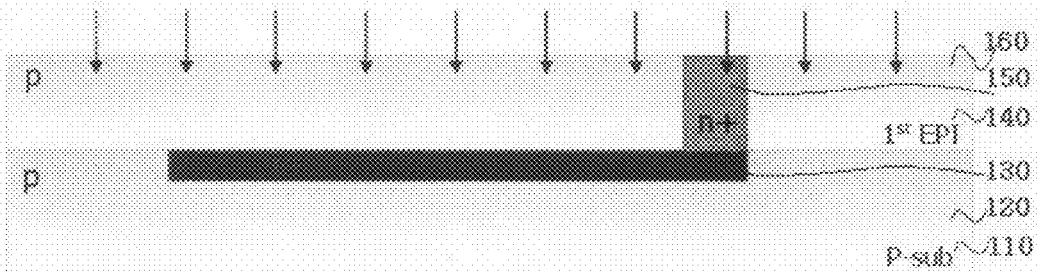

Thereafter, as shown in FIG. 6, first conductive-type ions are implanted into the first epitaxial layer 140 with the first plug 150 therein, thereby forming the second well 160. In addition, the second well 160 may be formed by implanting P-type ions in a blanket (e.g., unmasked) ion implantation process. In an alternative embodiment, the second well 160 may be formed before the first plug 150. Generally, the first plug 150 has a depth greater than that of the second well 160, and a dose or concentration greater than that of the second well 160, generally by about 1 to 2 orders of magnitude.

Figure 7:
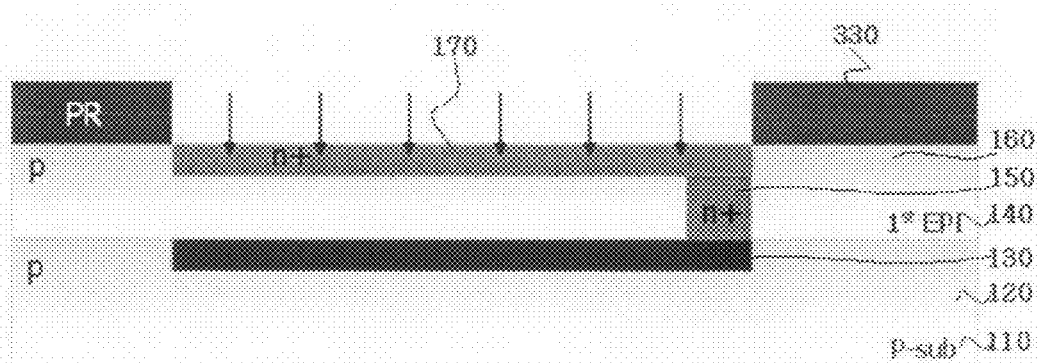

Then, as shown in FIG. 7, second conductive-type ions are implanted into the second well 160 over the first ion implantation area 130 using a third photoresist pattern 330 as a mask, thereby forming a second ion implantation area 170. The second well 160 has a depth greater than that of the second ion implantation area 170, but the second ion implantation area 170 has a dose or concentration greater than that of the second well 160, generally by about 1 to 2 orders of magnitude. Also, the second ion implantation area 170 may be formed before the second well 160 and/or the first plug 150. However, the implantation areas are preferably formed in the order of their depth (i.e., the deepest area is implanted first), to reduce any effect of implanted ions being driven (or "recoiled") farther into the epitaxial layer 140 than their implant energy provides, for example.

Figure 8:
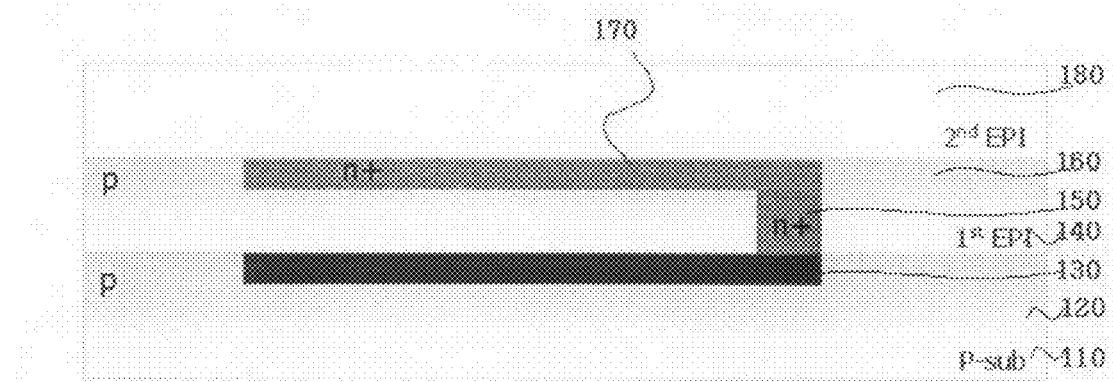

Thereafter, as shown in FIG. 8, the third photoresist pattern 330 is removed, and a second epitaxial layer 180 is formed on the first epitaxial layer 140 with the second ion implantation area 170 formed therein. Generally, the second epitaxial layer 180 is formed in the same manner as the first epitaxial layer 140.

Figure 9:
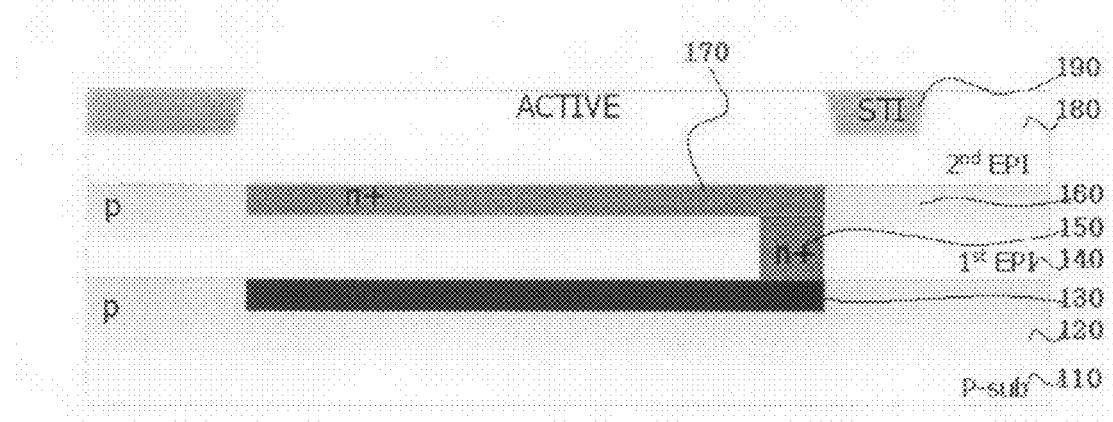

Then, as shown in FIG. 9, isolation areas 190 are formed in the second epitaxial layer 180, generally at sides of the second ion implantation area 170. However, to further reduce the area of the varactor, the isolation areas 190 may be formed over the outermost vertical borders of the second ion implantation area 170. The isolation area 190 may be formed by a shallow trench isolation (STI) process or a local oxidation of silicon (LOCOS) process.

Figure 10:
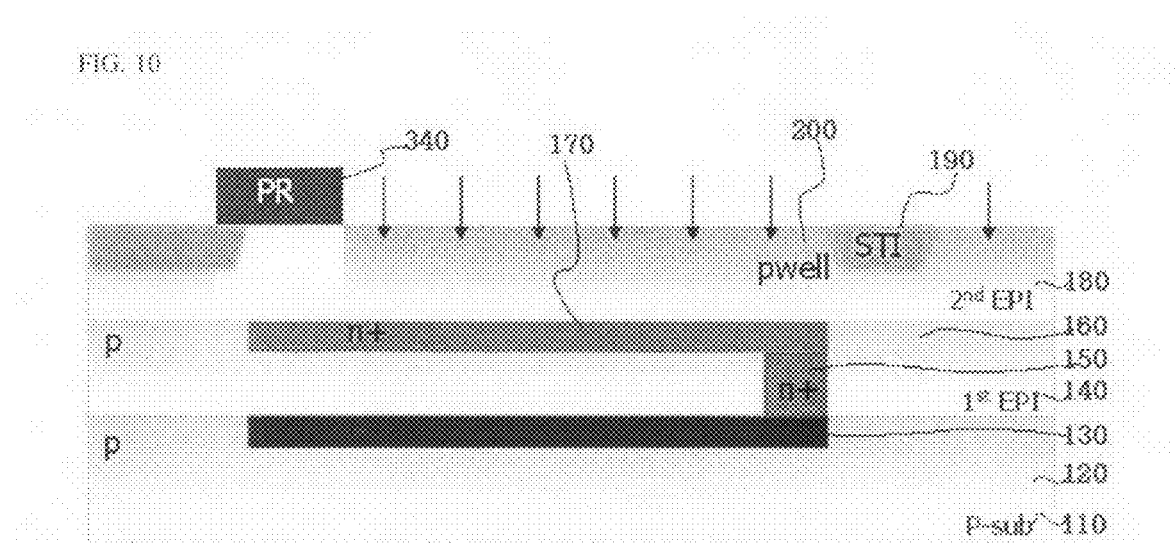

Then, as shown in FIG. 10, first conductive-type ions are implanted into the second epitaxial layer 180 with the isolation areas 190 therein to form a third well 200. In one embodiment, the first conductive-type ions are implanted in the entire second epitaxial layer 180 except for a portion of the second epitaxial layer 180 that is blocked by a fourth photoresist pattern 340 used as a mask. Alternatively, forming the third well 200 may comprise a blanket (e.g., unmasked) implant. The third well 200 may have a depth about the same as or greater than that of isolation layer 190.

Figure 11:
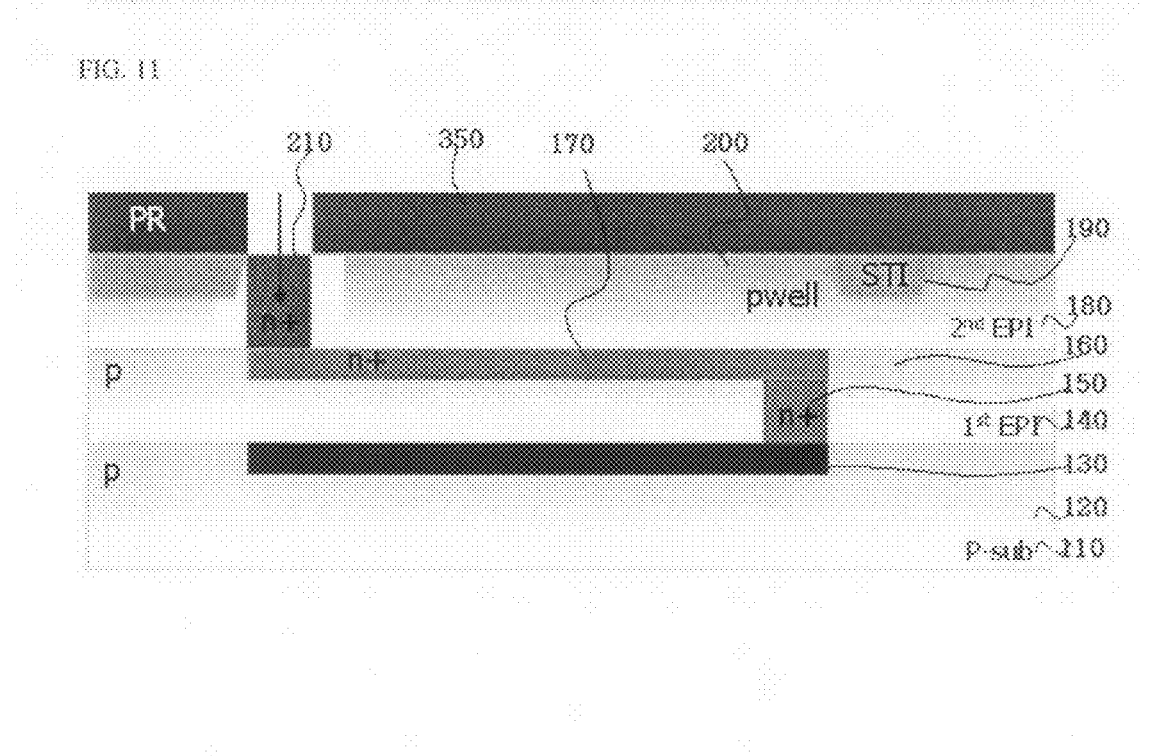

Thereafter, as shown in FIG. 11, the fourth photoresist pattern 340 is removed, and second conductive-type ions are implanted into the previously masked portion of the second epitaxial layer 180 using a fifth photoresist pattern 350 as a mask, thereby forming a second plug 210 electrically connected to the second ion implantation area 170. The second plug 210 has a depth and a dose/concentration greater than the depth and dose/concentration of the third well 200. The difference in dose and/or concentration is generally by about 1 to 3 orders of magnitude.

Figure 12:
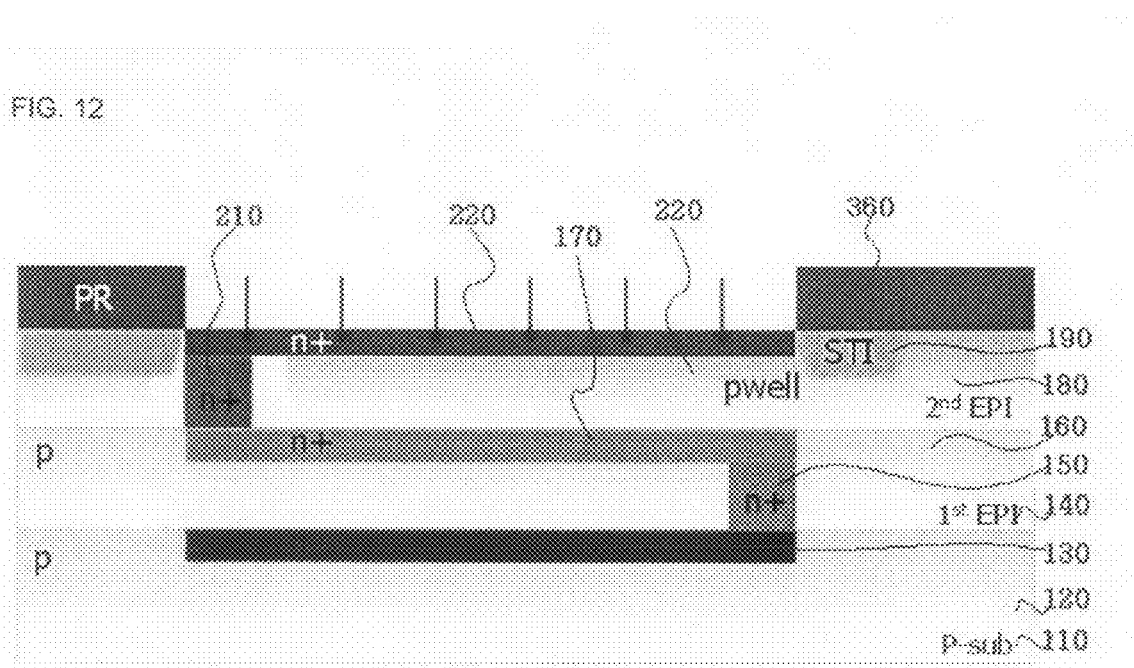

Subsequently, as shown in FIG. 12, the fifth photoresist pattern 350 is removed, and second conductive-type ions are implanted into the third well 200 and an upper portion of the second plug 210 using a sixth photoresist pattern 360 as a mask, thereby forming a third ion implantation area 220 electrically connected to the second plug 210.

The third well 200 has a depth greater than that of the third ion implantation area 220, but the third ion implantation area 220 has a dose or concentration greater than that of the third well 200, generally by about 1 to 2 orders of magnitude. Also, the third ion implantation area 220, the third well 200 and the second plug 210 may be formed in any order. However, the implantation areas are preferably formed in the order of their depth (i.e., the deepest area is implanted first), to reduce any effect of recoiled implanted ions, for example.

Figure 13:
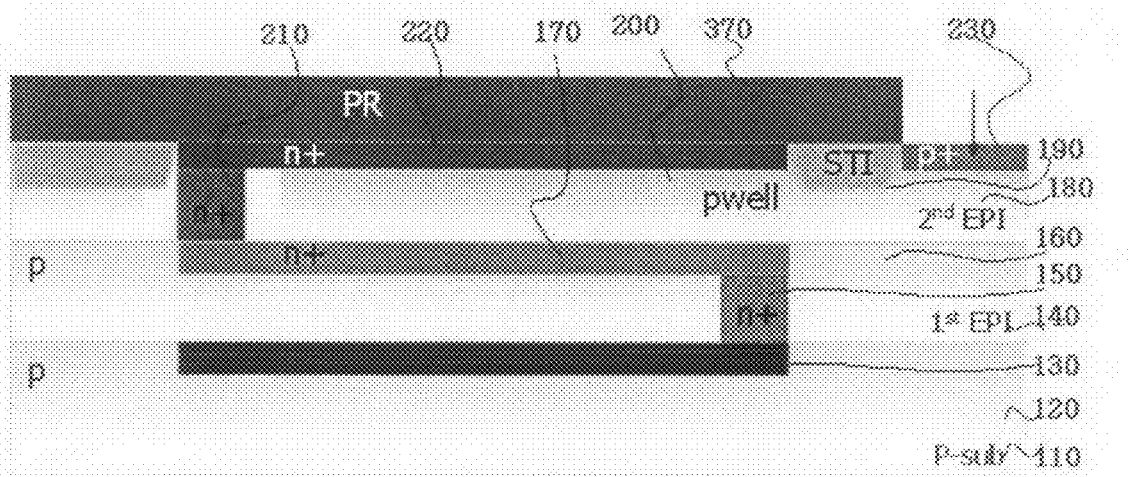

Subsequently, as shown in FIG. 13, the sixth photoresist pattern 360 is removed, and a first conductive-type ion implantation area 230 is formed in the third well 200 on an opposite side of the isolation area 190, thereby electrically disconnecting the first conductive-type ion implantation area 230 from the third ion implantation area 220. The ion implantation area 230 may be implanted with a high concentration of P-type ions.

In addition, according to another embodiment, steps of forming at least one first conductive-type well (not shown), a second conductive-type ion implantation area (not shown) in the first conductive-type well, and a plug (not shown) to be electrically connected to the second conductive-type ion implantation area, may be further performed after the second epitaxial layer 180 is formed.

The present invention enjoys a significant advantage when used in a device or chip having at least one such epitaxial layer and at least one set of such process steps, such as a CMOS image sensor, or an analog or mixed signal integrated circuit. The present invention may enjoy a particularly significant advantage when used in a vertical CMOS image sensor, a device generally having two epitaxial layers and substantially the same implantation steps as the exemplary embodiment depicted in FIGS. 1-13.

Differently from the related art, the varactor and the method for manufacturing the varactor according to embodiments of the present invention can realize a new N+/P well junction varactor device having high capacitance and a similar (and possibly smaller) size as that of the related N+/P well junction varactor by providing a plurality of vertical first conductive-type wells on the substrate, a plurality of vertical second conductive ion implantation areas 130, 170, and 220 in the first conductive-type wells, and at least one second conductive-type plug which electrically connects adjacent second conductive-type ion implantation areas.

In addition, according to embodiments of the invention, the varactor is applied to various semiconductor devices such as a CMOS image sensor, so that a semiconductor device having high capacitance may be realized.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A method for manufacturing a varactor, the method comprising the steps of:
    forming a first well by implanting a first conductive-type ion onto a substrate;
    forming a first ion implantation area by implanting a second conductive-type ion into the first well;
    forming a first epitaxial layer on the substrate, including the first ion implantation area;
    forming a first plug by implanting second conductive-type ions into a portion of the first epitaxial layer, in which the first plug is electrically connected to the first ion implantation area;
    forming a second well by implanting ions into the first epitaxial layer;
    forming a second ion implantation area by implanting second-conductive type ions into the second well;
    forming a second epitaxial layer on the first epitaxial layer having the second ion implantation area therein;
    forming a plurality of isolation areas in the second epitaxial layer;
    forming a third well by implanting first conductive-type ion into the second epitaxial layer;
    forming a second plug by implanting second conductive-type ions onto a portion of the second epitaxial area, in which the second plug is electrically connected to the second ion implantation area;
    forming a third ion implantation area by implanting second conductive-type ions into the third well on the second ion implantation area, so that the third ion implantation area is electrically connected to the second plug; and
    forming a first conductive-type ion implantation area on a portion of the third well electrically disconnected from the third ion implantation area by at least one of the isolation areas.

2. The method as claimed in claim 1, wherein the first conductive-type ion is a P-type ion.

3. The method as claimed in claim 1, wherein the first conductive-type wells have a same potential.

4. The method as claimed in claim 1, wherein the second conductive-type ion is an N-type ion.

5. The method as claimed in claim 4, wherein the second conductive-type ion is implanted in a high concentration.

6. The method as claimed in claim 1, further comprising the steps of:
   forming at least one first conductive-type well;
   forming a second conductive-type ion implantation area in the first conductive-type well; and
   forming a plug electrically connected to the second conductive-type ion implantation area, after forming the second epitaxial layer.

7. The method as claimed in claim 6, wherein the first conductive-type ion is a P-type ion.

8. The method as claimed in claim 6, wherein a plurality of first conductive wells are provided, and the first conductive-type wells have a same potential.

9. The method as claimed in claim 6, wherein the second conductive-type ion is an N-type ion.

10. The method as claimed in claim 9, wherein the second conductive-type ion is implanted in a high concentration.

11. The method as claimed in claim 1, wherein forming the third well further comprises forming a mask over a predetermined plug area in the second epitaxial layer and implanting the first conductive-type ions into the second epitaxial layer using the mask to block implantation into the predetermined plug area.

12. The method as claimed in claim 1, wherein the first well has a depth greater than a depth of the first ion implantation area, and the first ion implantation area has a concentration greater than that of the first well.

13. The method as claimed in claim 1, wherein the first epitaxial layer comprises epitaxial silicon.

14. The method as claimed in claim 1, wherein the first epitaxial layer comprises silicon-germanium.

15. The method as claimed in claim 1, wherein the first plug has a depth of at least the thickness of the first epitaxial layer.

16. The method as claimed in claim 1, wherein the first conductive type is N-type, and the second conductive type is P-type.

17. The method as claimed in claim 1, wherein the first plug has a depth greater than a depth of the second well and a concentration greater than that of the second well.

18. The method as claimed in claim 1, wherein the second well has a depth greater than a depth of the second ion implantation area, and the second ion implantation has a concentration greater than that of the second well.

19. The method as claimed in claim 1, wherein the third well has a depth greater than a depth of the isolation area.

20. The method as claimed in claim 1, wherein the second plug has a depth greater than the depth of the third well and a concentration greater than that of the third well.

* * * * *